United States Patent [19]

Matsumoto et al.

[11] Patent Number: 5,668,052

[45] Date of Patent: Sep. 16, 1997

[54] METHOD OF MANUFACTURING SEMICONDUCTOR DEVICE

[75] Inventors: Junko Matsumoto; Shigenori Sakamori, both of Tokyo, Japan

[73] Assignee: Mitsubishi Denki Kabushiki Kaisha, Tokyo, Japan

[21] Appl. No.: 678,538

[22] Filed: Jul. 5, 1996

[30] Foreign Application Priority Data

Nov. 7, 1995 [JP] Japan ..................... 7-288546

[51] Int. Cl.⁶ ........................................... H01L 21/44
[52] U.S. Cl. ........................ 438/624; 438/740; 438/952; 438/636
[58] Field of Search ............................. 437/183, 186, 437/187, 189, 192, 196, 203

[56] References Cited

U.S. PATENT DOCUMENTS

| | | | |
|---|---|---|---|
| 4,892,845 | 1/1990 | Bridges | 437/195 |
| 5,169,800 | 12/1992 | Kobayashi | 437/187 |
| 5,169,801 | 12/1992 | Sato | 437/187 |
| 5,221,634 | 6/1993 | Cho et al. | 437/187 |
| 5,466,637 | 11/1995 | Kim | 437/187 |
| 5,534,460 | 7/1996 | Tseng et al. | 437/187 |
| 5,536,679 | 7/1996 | Park | 437/203 |

*Primary Examiner*—Kevin Picardat
*Attorney, Agent, or Firm*—Oblon, Spivak, McClelland, Maier & Neustadt, P.C.

[57] ABSTRACT

According to this invention, an etching stopper film constituted by a silicon nitride film is stacked on an insulating film constituted by a silicon oxide film for protecting a wiring to prevent damage to the wiring caused by anisotropic dry etching for forming a contact hole. A resist pattern having the same shape as that of the contact hole is formed by using a reflection prevention film containing nitrogen atoms, the etching stopper film and the reflection prevention film in a contact hole formation region which contain nitrogen atoms and have equal selectivity ratios under a predetermined condition are simultaneously removed by etching, so that a semiconductor device having stable performance and simple manufacturing steps can be obtained.

8 Claims, 9 Drawing Sheets

METHOD OF MANUFACTURING SEMICONDUCTOR DEVICE

BACKGROUND OF THE INVENTION

1. Field of the Invention

The present invention relates to formation of a contact using a self-alignment scheme and, more particularly, to a method of manufacturing a semiconductor device such as a DRAM whose yield can be improved by a small number of manufacturing steps.

2. Description of the Related Art

Figure 17:
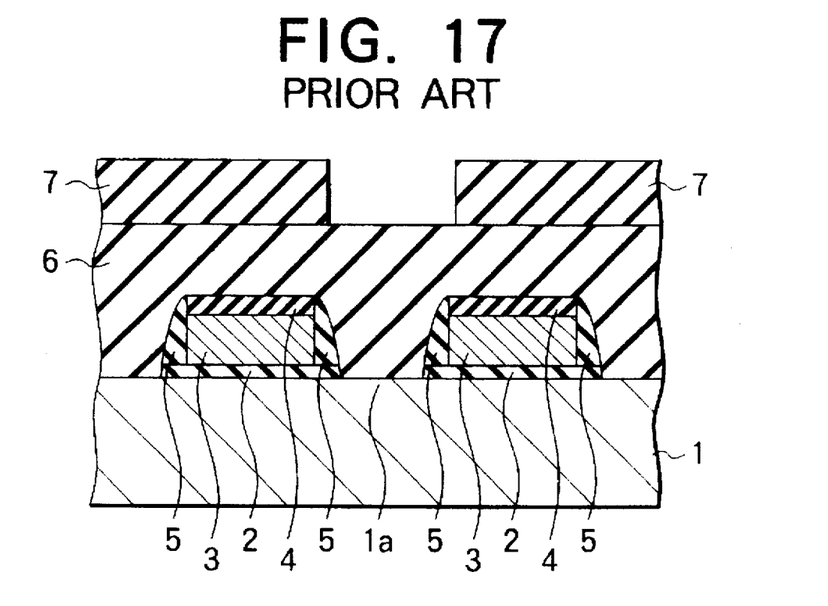
FIG. 17 is a sectional view showing one step of a conventional method of a semiconductor device.

In conventional steps in manufacturing a semiconductor device, for example, when a structure, having a lower wiring layer and an upper wiring layer, which is electrically connected to a conductive region of the surface of a semiconductor substrate through a contact is to be formed, as shown in FIG. 17, a gate insulating film 2 consisting of an oxide film is formed on one major surface of a semiconductor substrate 1 having a conductive region 1a formed on the surface of the semiconductor substrate 1, a conductive material layer consisting of polysilicon is stacked on the entire surface of the semiconductor substrate including the gate insulating film 2, and a silicon oxide film 4 is formed on the result structure to have a predetermined thickness. A resist pattern having a shape of wirings to be formed is patterned, the resultant structure is anisotropically etched by using the resist pattern as an etching mask, and conductive material layers prospectively serving as the silicon oxide film 4 and wirings 3 are sequentially etched to have predetermined sizes, respectively. Thereafter, an insulating film consisting of a silicon oxide film having a uniform thickness is formed on the entire surface of the semiconductor substrate 1 by a CVD technique. Thereafter, the resultant structure is etched back until one major surface of the semiconductor substrate 1 is partially exposed, thereby forming side walls 5 on the side surfaces of the wirings 3, the silicon oxide films 4, and the gate insulating films 2. The silicon oxide film 4 and the side walls 5 which are in contact with the upper and side surfaces of each wiring 3 are formed as protective films. A silicon oxide film serving as an insulating interlayer 6 is formed on the entire surface of the semiconductor substrate 1, and a resist pattern 7 having an opening having the same shape as that of a contact hole is formed on the insulating interlayer 6.

Figure 18:
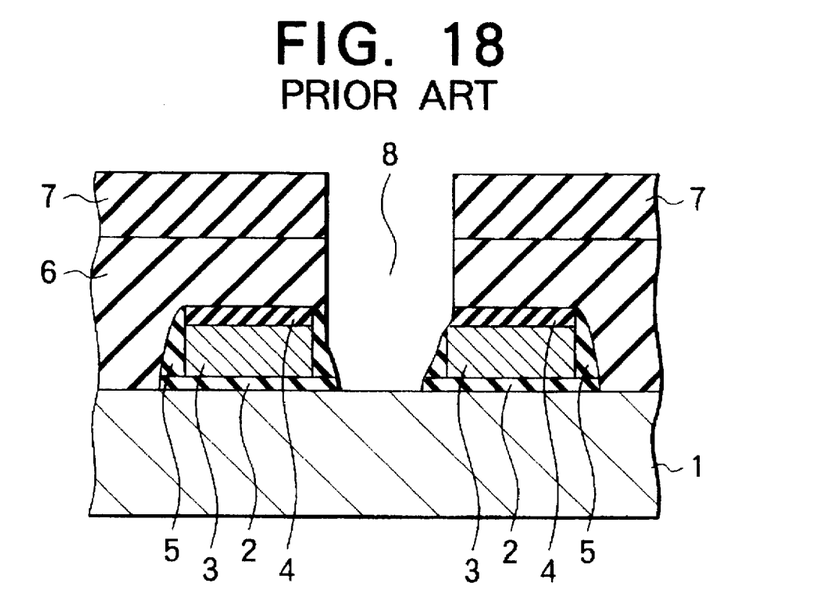
FIG. 18 is a sectional view showing one step of the conventional method of a semiconductor device.

Thereafter, as shown in FIG. 18, the resultant structure is anisotropically etched until one major surface of the semiconductor substrate 1 is partially exposed by using the resist pattern 7 as an etching mask, thereby forming a contact hole 8 in the insulating interlayer 6. The resist pattern 7 is removed, and a conductive material is buried in the contact hole 8, thereby forming a contact 9 shown in FIG. 19. Thereafter, an upper wiring layer 10 or the like is formed on the contact 9. In this manner the upper wiring layer 10 is electrically connected to the conductive region 1a is formed on the surface of the semiconductor substrate 1 through the contact 9.

However, when the contact 9 is to be formed between two wirings 3, the resist pattern 7 serving as the etching mask is positionally shifted. When the distance between the two wirings 3 is shorter than the diameter of the contact hole 8, as shown in FIG. 18, in anisotropic etching for forming the contact hole 8, the silicon oxide films 4 formed as the protective films of the wirings 3 and the side walls 5 constituted by a silicon oxide film are simultaneously etched at a selectivity ratio which is almost equal to that of the insulating interlayer 6, and the wirings 3 are exposed in the contact hole 8. When the wirings 3 are exposed when the contact hole 8 is formed, the contact 9 is formed by burying a conductive material in the contact hole 8 in the next step. For this reason, the wirings 3 may be short-circuited to the contact 9.

Figure 20:
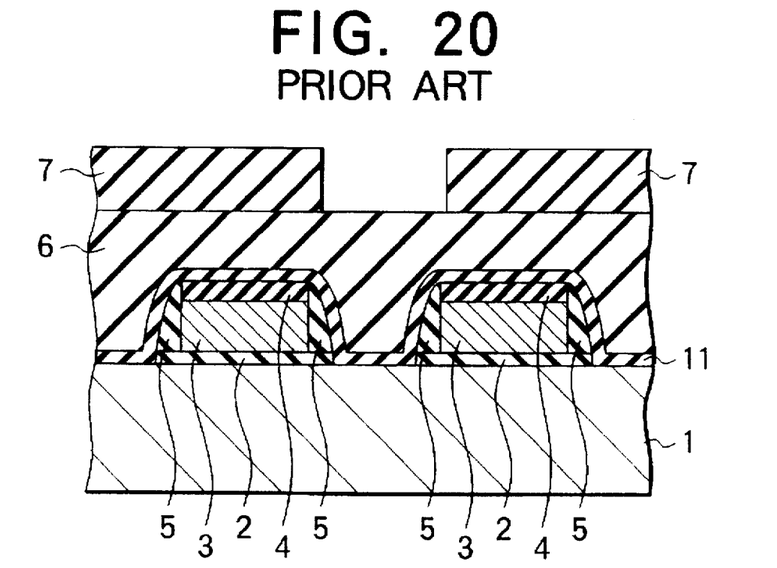
FIG. 20 is a sectional view showing one step of another conventional method of a semiconductor device.
Figure 21:
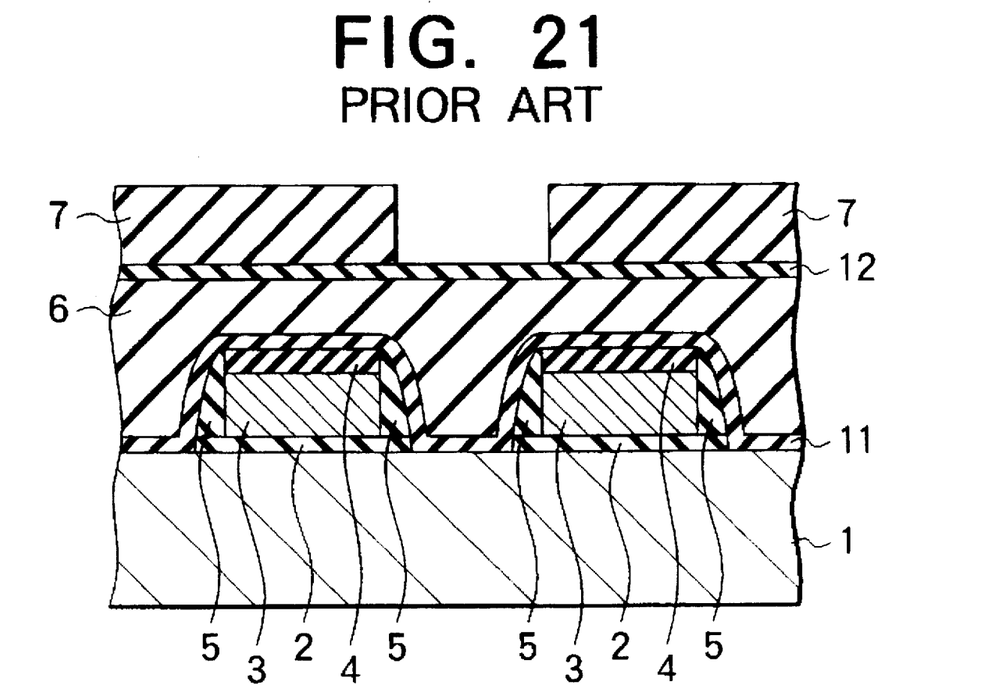
FIG. 21 is a sectional view showing one step of still another method of manufacturing a semiconductor device.

In order to suppress the short circuit between the wirings 3 and the contact 9 described above, in another conventional method of manufacturing a semiconductor device, as shown in FIG. 20, the silicon oxide films 4 and the side walls 5 serving as the protective films of the wirings 3 are formed. Thereafter, an etching stopper film 11 constituted by a silicon nitride film is stacked, and the etching stopper film 11 can be anisotropically etched at a high selectivity ratio when the contact hole 8 is formed. In still another conventional method of manufacturing a semiconductor device, as shown in FIG. 21, before the resist pattern 7 serving as an etching mask is formed, a reflection prevention film 12 is formed on the surface of the insulating interlayer 6. For this reason, the resist pattern 7 can be formed at high dimensional precision. In this case, removal of the reflection prevention film 12 and removal of the etching stopper film 11 on a contact formation region are performed in different steps, respectively.

Figure 19:
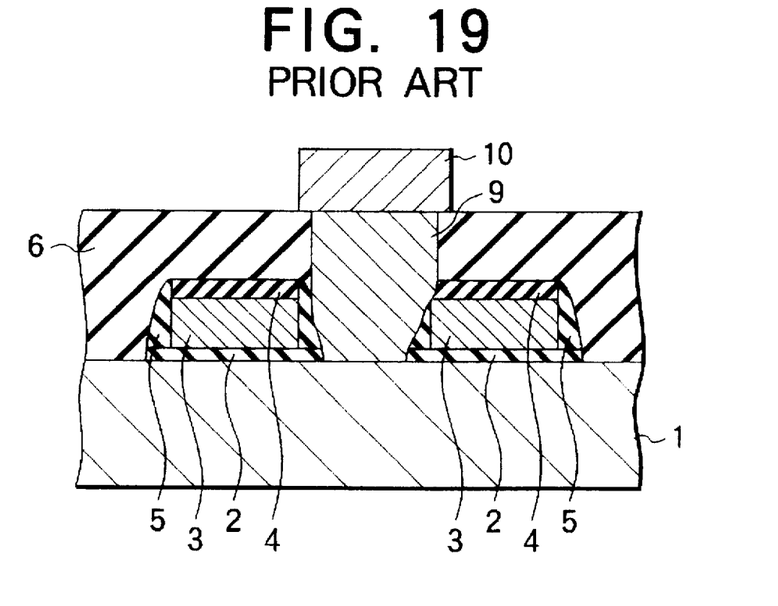
FIG. 19 is a sectional view showing one step of the conventional method of a semiconductor device.

As described above, in a conventional method of manufacturing a semiconductor device, when a contact is formed in a self-alignment manner between two adjacent wirings, as shown in FIG. 19, the wirings 3 and the contact 9 are short-circuited or almost short-circuited by shifting of a contact formation position caused by shifting of a contact formation position. The contact 9 and the wirings 3 are electrically influenced to each other. In addition, in another conventional method of manufacturing a semiconductor which solves the problem, when the etching stopper film 11 and the reflection prevention film 12 are formed to strengthen protection of the wirings 3 and to improve the dimensional precision of the etching mask, the etching stopper film 11 and the reflection prevention film 12 are removed in different steps, respectively. For this reason, the number of steps increases to remove these films, and a yield disadvantageously decreases.

SUMMARY OF THE INVENTION

The present invention has been made to solve the above problem, and has as its object to realize a method of manufacturing a semiconductor device in which a semiconductor device having a high precision can be formed in a small number of manufacturing steps.

According to the present invention, a method of manufacturing a semiconductor device comprising the steps of forming a wiring on one major surface of a semiconductor substrate, the step of forming an insulating film covering the upper and side surfaces of the wiring, the step of forming an etching stopper film on the entire surface of the semiconductor substrate, the step of forming an insulating interlayer on the etching stopper film, the step of forming a reflection prevention film on the insulating interlayer, the step of forming a resist pattern having a pattern having the same shape as that of a contact hole on the reflection prevention film, the step of removing the reflection prevention film and the insulating interlayer located on a contact formation region by using the resist pattern as an etching mask, the step of removing the resist pattern and simultaneously removing the reflection prevention film and the etching stopper film on the contact formation region by etching to form a contact hole, and the step of exposing one major surface of the semiconductor substrate of the contact hole formation region and burying a conductive material in the contact hole to form a contact.

In the method of manufacturing a semiconductor device according to the present invention, the etching stopper film and the reflection prevention film includes a material containing nitrogen.

In the method of manufacturing a semiconductor device according to the present invention, the etching stopper film and the reflection prevention film have film thicknesses which are almost equal to each other.

In the method of manufacturing a semiconductor device according to the present invention, the step of forming the contact hole includes the step of simultaneously removing the reflection prevention film and the etching stopper film on the contact formation region by anisotropic etching.

In the method of manufacturing a semiconductor device according to the present invention, the step of forming the contact hole includes the step of simultaneously removing the reflection prevention film and the etching stopper film on the contact formation region by isotropic etching.

In the method of manufacturing a semiconductor device according to the present invention, when the reflection prevention film is formed to have a thickness larger than the etching stopper film, the step of forming the contact hole includes the step of simultaneously removing the reflection prevention film and most of the etching stopper film on the contact formation region by anisotropic etching and removing the remaining etching stopper film by anisotropic etching.

In addition, in the method of manufacturing a semiconductor device according to the present invention, when the reelection prevention film is formed to have a thickness larger than the etching stopper film, the step of forming the contact hole includes the step of simultaneously removing the reflection prevention film and the etching stopper film on the contact formation region by etching using a microloading effect.

DESCRIPTION OF THE PREFERRED EMBODIMENTS

Embodiment 1.

An embodiment of the present invention will be described below with reference to FIGS. 1 to 9.

Figure 1:
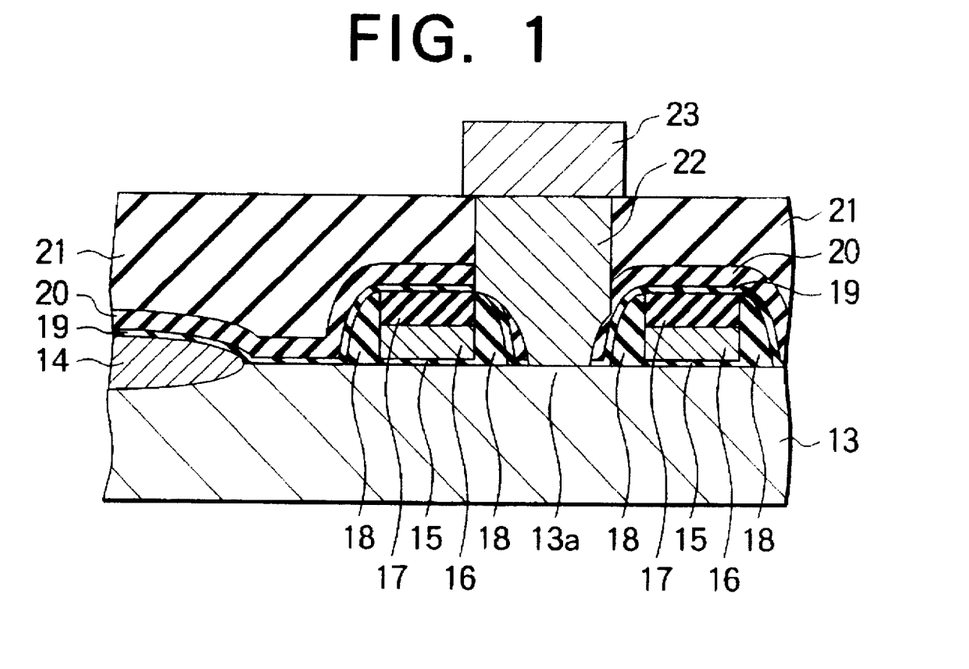
FIG. 1 is a sectional view showing a semiconductor device according to Embodiment 1 of the present invention.

The structure of a semiconductor device which can be finally obtained according to this embodiment is shown in FIG. 1. Referring to FIG. 1, reference numeral 13 denotes a semiconductor substrate; 14, an element isolation region constituted by a silicon oxide film formed on one major surface of the semiconductor substrate 13 by a thermal oxidation method; 15, gate insulating films constituted by an oxide film and formed on one major surface of the semiconductor substrate 13 by a thermal oxidation method; 16, wirings consisting of a conductive material such as polysilicon; 17, silicon oxide films formed on the wirings 16 and serving as wiring protective films; 18, side walls formed to be adhered to the side surfaces of the gate insulating films 15, the wirings 16, and the silicon oxide films 17, serving as protective films for the wirings 16, and constituted by silicon oxide films; 19, oxide films formed on the side walls 18, the silicon oxide films 17, one major surface (except for a portion where the semiconductor substrate 13 is in contact with a contact) of the semiconductor substrate 13, and the upper portion of the element isolation region 14; 20, etching stopper films constituted by silicon nitride films formed on the oxide films 19; 21, insulating interlayers stacked on the etching stopper films 20 and having planar surfaces; and 22, a contact, formed in a portion extending from the upper surface of the insulating interlayers 21 to one major surface of the semiconductor substrate 13, for electrically connecting an upper wiring layer 23 formed on the contact 22 to a conductive region 13a formed on the surface of the semiconductor substrate 13.

Steps in a method of manufacturing a semiconductor device shown in FIG. 1 will be sequentially described below.

Figure 2:
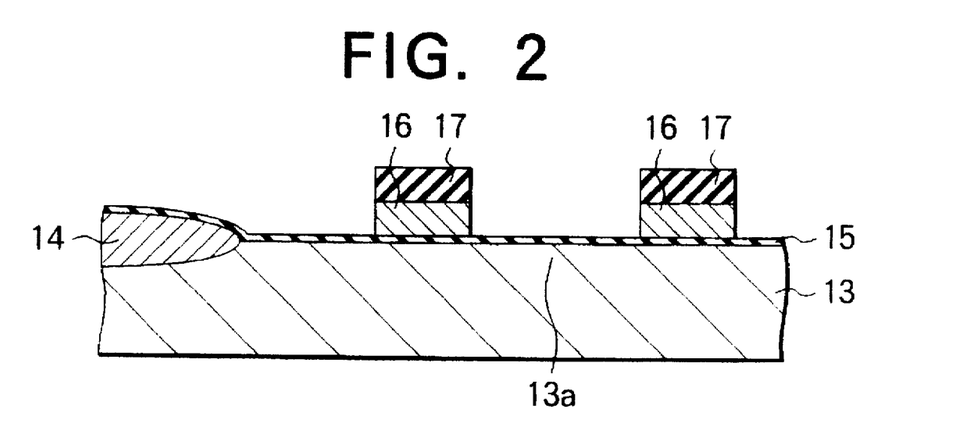
FIG. 2 is a sectional view showing one step of a method of manufacturing a semiconductor device according to Embodiment 1 of the present invention.

As shown in FIG. 2, the element isolation region 14 constituted by a silicon oxide film is formed on one major surface of the semiconductor substrate 13 by a thermal oxidation method, and the entire surface of the semiconductor substrate 13 is oxidized by a thermal oxidation method to form the gate insulating film 15. Thereafter, a polysilicon film containing a predetermined impurity is stacked on the entire surface of the semiconductor substrate 13, and a silicon oxide film serving as an insulating film is stacked on the upper layer. A resist pattern is formed to cover the polysilicon film to be left as wirings, and the silicon oxide film and the polysilicon film are sequentially patterned as the resist pattern as an etching mask. In this manner, the silicon oxide films 17 each having a predetermined size and the wirings 16 constituted by polysilicon films are formed.

Figure 3:
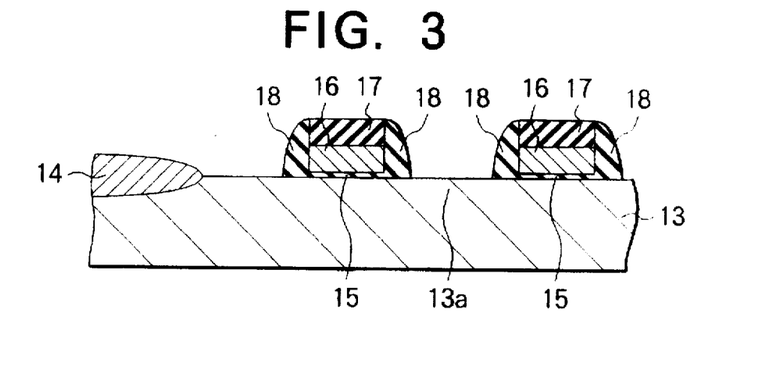
FIG. 3 is a sectional view showing one step of a method of manufacturing a semiconductor device according to Embodiment 1 of the present invention.

As shown in FIG. 3, a silicon oxide film is stacked on the entire surface of the semiconductor substrate 13 by using a CVD technique. Thereafter, the resultant structure is anisotropically etched to remove the silicon oxide film and the gate insulating films 15 until one major surface of the semiconductor substrate 13 is partially exposed, and the side walls 18 are formed on the side surfaces of the wirings 16.

Figure 4:
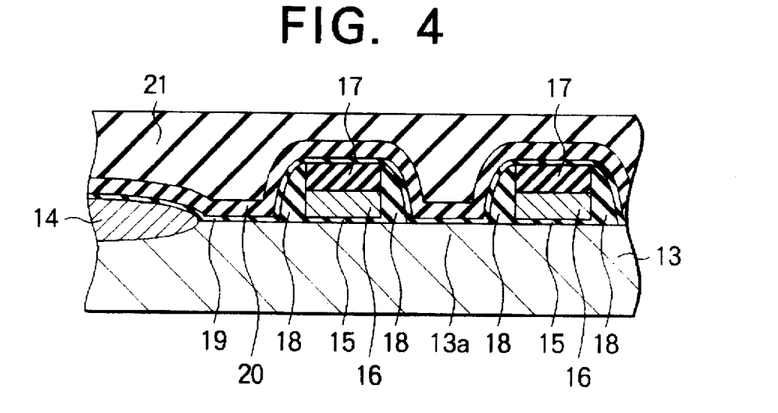
FIG. 4 is a sectional view showing one step of a method of manufacturing a semiconductor device according to Embodiment 1 of the present invention.

As shown in FIG. 4, the oxide film 19 which is a kind of an insulating film is stacked on the entire surface of the semiconductor substrate 13 by using a CVD technique, and the etching stopper film 20 constituted by an insulating film such as a silicon nitride film containing nitrogen atoms is stacked on the oxide film 19. Thereafter, the insulating interlayer 21 which has an uneven surface because the insulating interlayer 21 is formed on the wirings 16 and the like is etched back by RIE (anisotropic reactive ion etching) or annealed to be reflowed, thereby making the surface of the insulating interlayer 21 planar.

Figure 5:
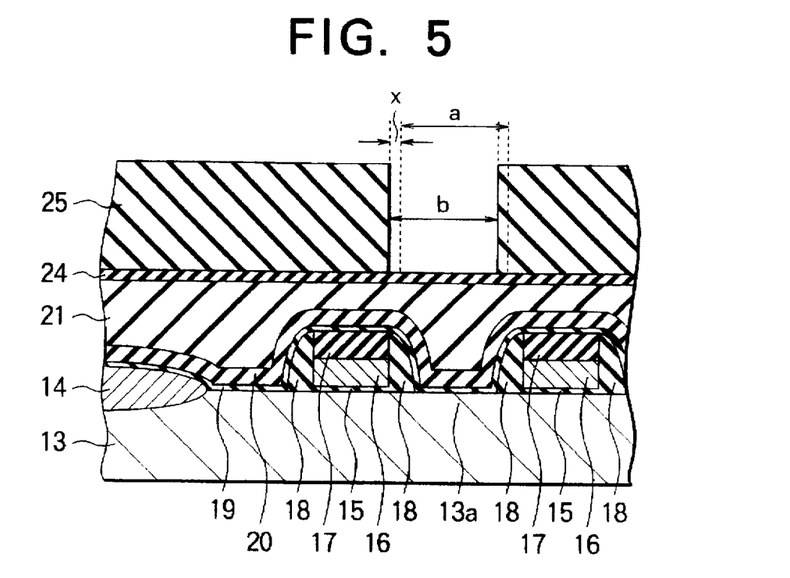
FIG. 5 is a sectional view showing one step of a method of manufacturing a semiconductor device according to Embodiment 1 of the present invention.

Thereafter, as shown in FIG. 5, a reflection prevention film 24 consisting of a material containing nitrogen is formed on the upper surface of the insulating interlayer 21 having the planar surface by a plasma CVD technique to have a film thickness almost equal to that of the etching stopper film 20. When this reflection prevention film 24 is formed, the dimensional precision of a resist pattern 25 formed in the next photolithography step can be improved. The resist pattern 25 formed by photolithography immediately above the reflection prevention film 24 is used as a contact hole etching mask for burying a contact for electrically connecting the conductive region 13a formed in the semiconductor substrate 13 to the upper wiring layer 23 formed above the conductive region 13a and at a level higher than that of the insulating interlayer 21.

Figure 6:
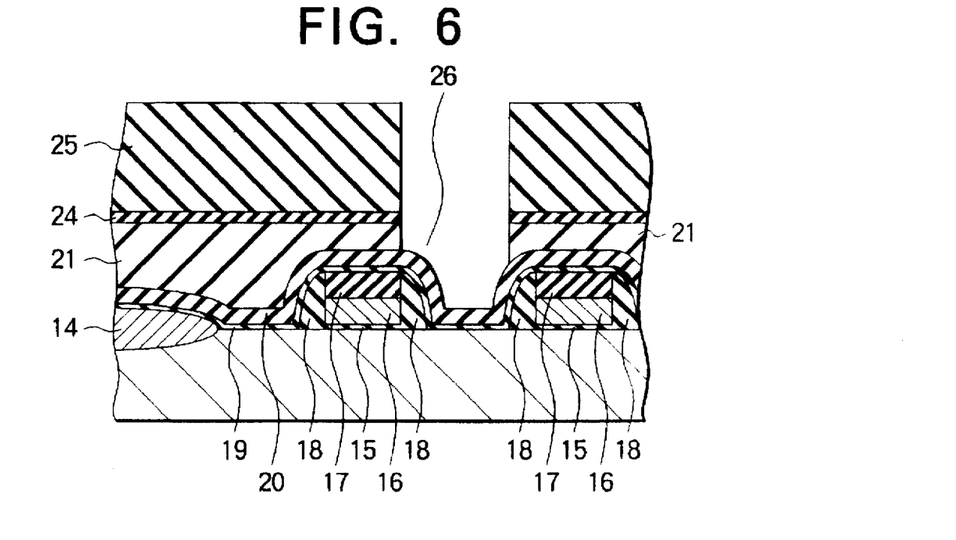
FIG. 6 is a sectional view showing one step of a method of manufacturing a semiconductor device according to Embodiment 1 of the present invention.

This resist pattern 25 shows a state wherein an opening b is formed in such a manner that the position of an opening a serving as an original contact hole is shifted by a distance x by shifting of photolithography. However, as will be described later, since the etching stopper film 20 is formed, the wirings 16 and the contact 22 can be prevented from being short-circuited by the shifting of photolithography. As shown in FIG. 6, dry etching is performed by using a gas such as $CF_4$ and the resist pattern 25 as a mask to remove the reflection prevention film 24 located on the position of the opening b in which the contact is to be formed. Subsequently, by dry etching using a gas such as $C_4F_8$, the insulating interlayer 21 is etched under a condition in which the etching rate of an oxide film with respect to a nitride film increases (condition in which a selectivity ratio is set to be 5 or more) until the etching stopper film 20 is partially exposed.

Figure 7:
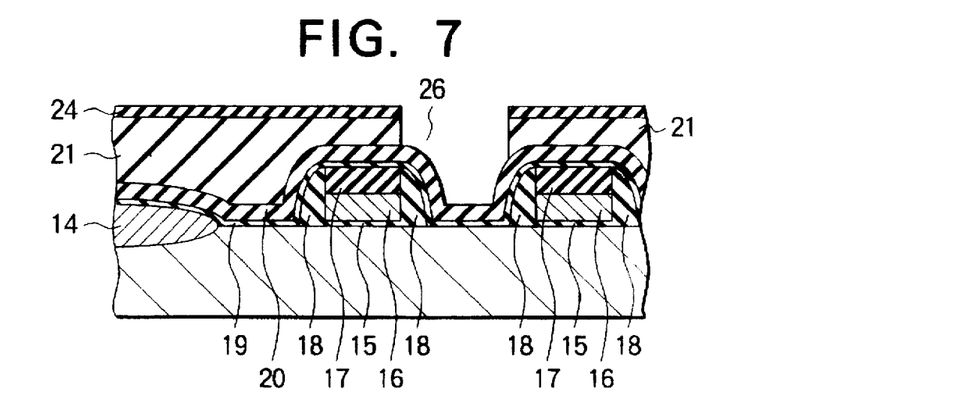
FIG. 7 is a sectional view showing one step of a method of manufacturing a semiconductor device according to Embodiment 1 of the present invention.
Figure 8:
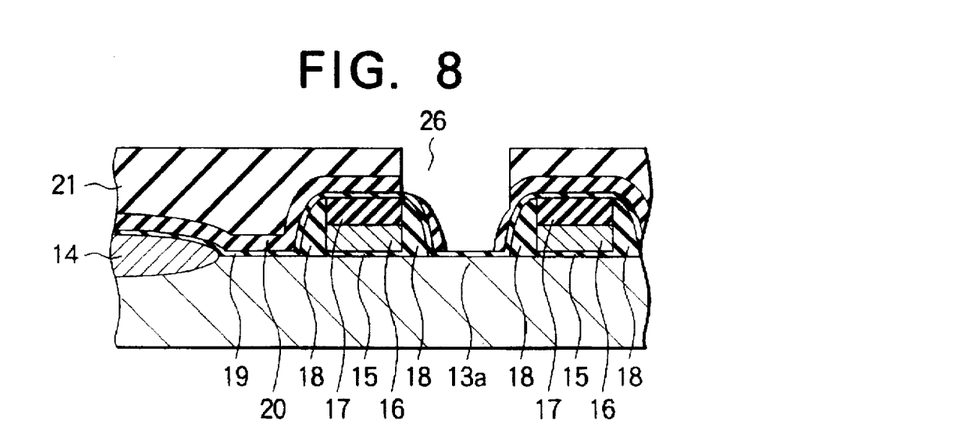
FIG. 8 is a sectional view showing one step of a method of manufacturing a semiconductor device according to Embodiment 1 of the present invention.

Thereafter, as shown in FIG. 7, the resist pattern 25 is removed by using a resist removing apparatus. As shown in FIG. 8, the selectivity ratio of the silicon oxide films such as the oxide film 19 and the insulating interlayer 21 to the film such as the etching stopper film 20 containing nitrogen atoms is set to be 1, and the reflection prevention film 24 and the etching stopper film 20 are anisotropically etched under a dry etching condition using a gas such as $CF_4$ until the oxide film 19 on the contact formation region is exposed, thereby forming a contact hole 26.

At this time, since the reflection prevention film 24 is constituted by a film consisting of a material containing nitrogen atoms, the film seed of the reflection prevention film 24 is similar to that of the etching stopper film 20, and the selectivity ratio of the etching rates of the reflection prevention film 24 and the etching stopper film 20 approximates to 1. Therefore, when the film thicknesses of the reflection prevention film 24 and the etching stopper film 20 are almost equal to each other, these films can be simultaneously removed.

After the etching stopper film 20 and the reflection prevention film 24 are simultaneously removed, a by-product or the like formed to be adhered to the inner wall of the contact hole 26 is removed by a chemical dry etching (CDE) process, and the step of cleaning a contact interface is additionally performed, so that a semiconductor device having more stable performance can be obtained.

Figure 9:
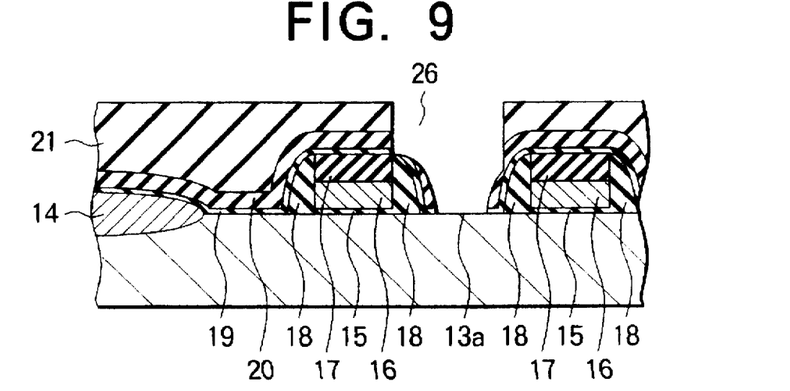
FIG. 9 is a sectional view showing one step of a method of manufacturing a semiconductor device according to Embodiment 1 of the present invention.

As shown in FIG. 9, the oxide film 19 on the bottom portion of the contact hole 26 is removed by etching until one major surface (conductive region 13a) of the semiconductor substrate 13 is exposed. This step of removing the oxide film 19 is performed subsequent to the previous step of removing the etching stopper film 20 and the reflection prevention film 24. In the step of removing the oxide film 19, since RIE is performed after a gas seed in the etching apparatus is replaced, a processing time can be shortened.

A conductive material such as polysilicon is buried in the contact hole 26 to form the contact 22, and the upper wiring layer 23 is patterned to be in contact with the upper portion of the contact 22, thereby obtaining the semiconductor device shown in FIG. 1.

The semiconductor formed described above can be manufactured at low cost in the simple steps within a short time for the following reason. That is, in a manufacturing method using a self-alignment scheme, the reflection prevention film 24 required to improve precision of photolithography and the etching stopper film 20 on the contact hole formation region (opening) can be simultaneously removed by etching. In addition, a fine contact having excellent dimensional stability can be formed. Therefore, the degree of integration can be improved, the etching stopper film 20 can prevent the wirings 16 and the contact 22 from being short-circuited, and the production yield and reliability of the semiconductor device are improved.

Embodiment 2

Another embodiment of the present invention will be described below.

Figure 10:
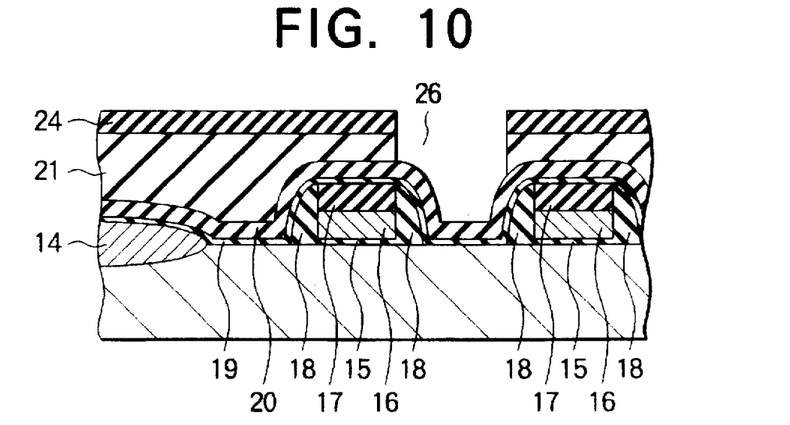
FIG. 10 is a sectional view showing one step of a method of manufacturing a semiconductor device according to Embodiment 2 of the present invention.

The characteristic features of Embodiment 2 are as follows. In Embodiment 1 described above, in the manufacturing step in FIG. 7 used for explaining Embodiment 1, the thicknesses of the etching stopper film 20 and the reflection prevention film 24 are set to be almost equal to each other. However, in Embodiment 2, as shown in FIG. 10, assume that the reflection prevention film 24 is formed to have a thickness which is slightly larger than that of the etching stopper film 20. This is because the reflection prevention film 24 and the etching stopper film 20 cannot be easily formed to have thicknesses which are almost equal to each other. The reference numerals as in Embodiment 1 denote the same or corresponding parts in Embodiment 2. The manufacturing steps in Embodiment 2 are the same as those in Embodiment 1 except for the thicknesses of the etching stopper film 20 and the reflection prevention film 24. In Embodiment 2, the etching stopper film 20 and the reflection prevention film 24 consist of a material containing nitrogen atoms.

As shown in FIG. 10, silicon oxide films 17 and side walls 18 covering wirings 16, an oxide films 19, an etching stopper film 20, an insulating interlayer 21 in which a contact hole 26 is formed, the reflection prevention film 24 formed on the insulating interlayer 21 to have a thickness larger than that of the etching stopper film 20 are formed. The etching stopper film 20 on the bottom surface of the contact hole 26 is left unetched.

In this state, an etching ratio (selectivity ratio) of the oxide film to the nitride film is small, i.e., 1 or less, and the reflection prevention film 24 and the etching stopper film 20 are anisotropically etched by using a gas such as $CF_4$ under a condition in which the ratio of etching rates (RIE-lag) is increased by a pattern aspect ratio until the reflection prevention film 24 is removed.

Figure 11:
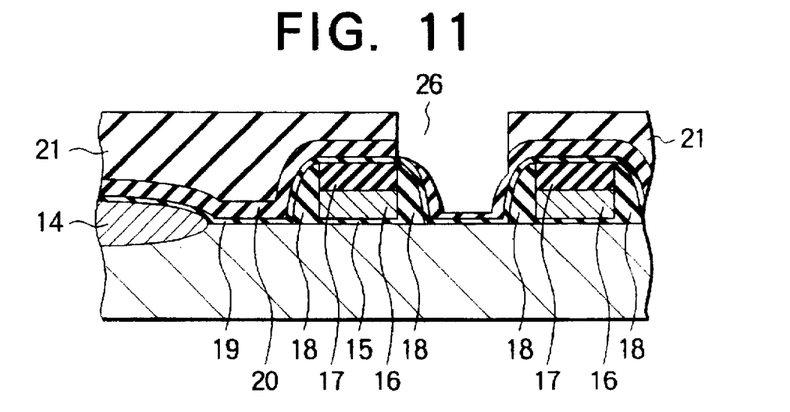
FIG. 11 is a sectional view showing one step of a method of manufacturing a semiconductor device according to Embodiment 2 of the present invention.

As shown in FIG. 11, in this etching, dry etching is performed under a condition in which the ratio of etching rates is increased by the pattern aspect ratio. For this reason, the etching rate of the etching stopper film 20 located on the bottom surface portion of the contact hole 26 is lower than the etching rate of the reflection prevention film 24 exposed outside the contact hole 26. When the reflection prevention film 24 is completely removed, the etching stopper film 20 is left in the contact hole 26 to have a small thickness.

Figure 12:
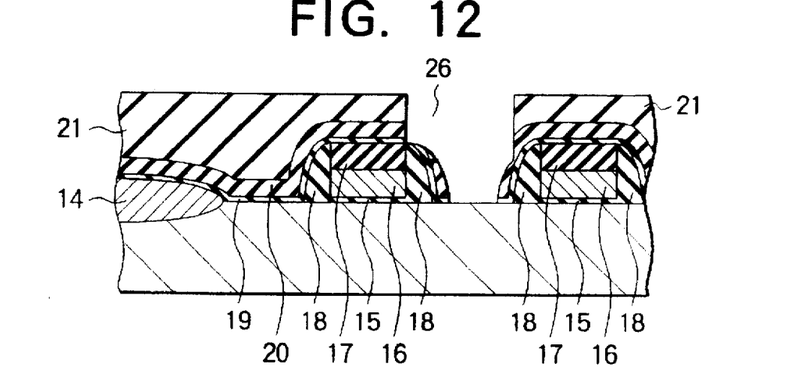
FIG. 12 is a sectional view showing one step of a method of manufacturing a semiconductor device according to Embodiment 2 of the present invention.

As shown in FIG. 12, the etching stopper film 20 and the thin oxide film 19 left in the contact hole 26 are removed by anisotropic dry etching to expose the conductive region 13a formed on the surface of the semiconductor substrate 13, so that the contact hole 26 can be completed. Thereafter, as in Embodiment 1, a conductive material is buried in the contact hole 26 to form a contact 22, and an upper wiring layer 23 is patterned on the contact 22. In this manner, a semiconductor device having the same shape and performance as those of the semiconductor device in FIG. 1 can be obtained.

After the etching stopper film 20 and the reflection prevention film 24 are removed, a by-product or the like adhered to the inner wall of the contact hole 26 is removed by a chemical dry etching (CDE) process. The step of cleaning a contact interface is added, thereby obtaining a semiconductor device having more stable performance.

In this embodiment, since the step of etching reflection prevention film 24 and the step of etching the insulating interlayer 21 are performed by RIE, these steps can be continuously performed. Therefore, in the steps in manufacturing the semiconductor device, films of different types can be removed in the same chamber by etching within a short time, and the semiconductor device can be manufactured at low cost.

According to the method of manufacturing a semiconductor device according to this embodiment, when a self-alignment scheme is used, the reflection prevention film 24 required for photolithography and the etching stopper film 20 located at a position where the contact hole 26 is to be formed can be almost simultaneously removed, the steps in manufacturing the semiconductor can be simplified. The fine contact hole 26 having excellent dimensional stability can be formed, and the degree of integration can be improved. Furthermore, the production yield and reliability of the semiconductor device can be improved without short-circuiting the wirings 16 serving as gate electrodes and the contact 22.

Embodiment 3

Still another embodiment will be described below with reference to FIGS. 13 to 16. Referring to FIGS. 13 to 16, reference numeral 27 denotes a reflection prevention film consisting of a material containing nitrogen atoms, and reference numeral 28 denotes a resist pattern in which an opening b is formed in a region for forming a contact hole 26. The other reference numerals as in Embodiment 1 or 2 denote the same or corresponding parts in Embodiment 3.

Figure 13:
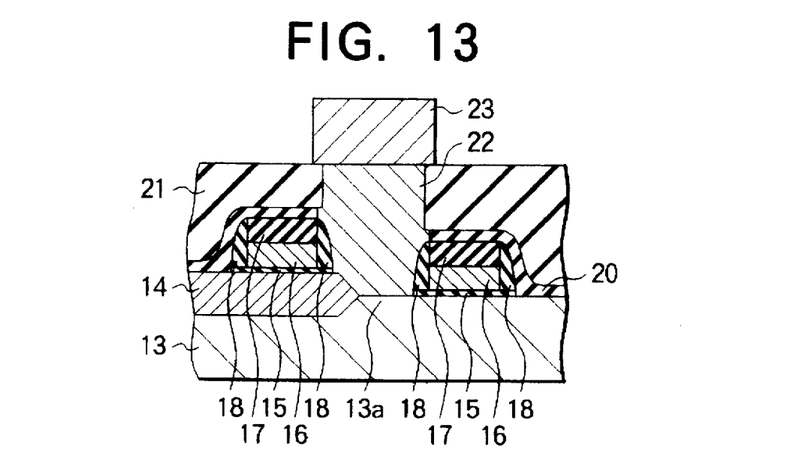
FIG. 13 is a sectional view showing a semiconductor device according to embodiment 3 of the present invention.

FIG. 13 is a sectional view showing a main part of a semiconductor device in which wirings 16 formed on a semiconductor substrate 13 or an element isolation region 14, silicon oxide films 17 and side walls 18 serving as protective films for the wirings 16, an etching stopper film 20 containing nitrogen atoms and formed to cover these protective films, an insulating interlayer constituted by a silicon oxide film formed on the etching stopper film 20, a contact 22 consisting of a conductive material and formed in an insulating interlayer 21 which is in contact with the conductive region 13a on the surface of the semiconductor substrate 13, and an upper wiring layer 23 formed to be in contact with the contact 22 are formed.

Figure 14:
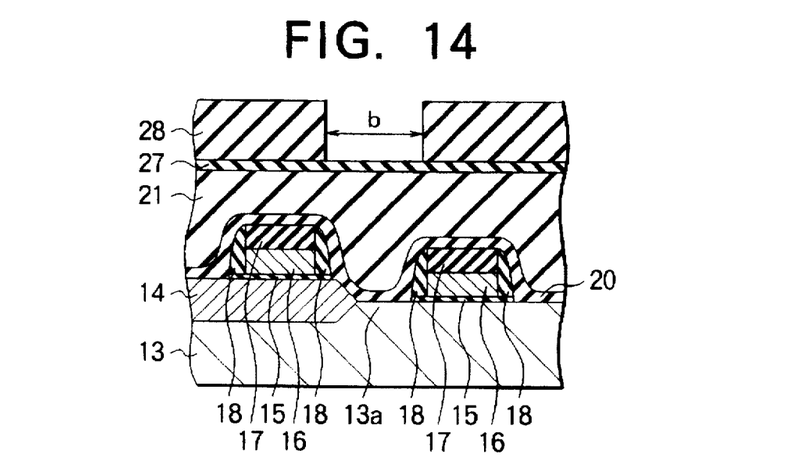
FIG. 14 is a sectional view showing one step of a method of manufacturing a semiconductor device according to Embodiment 3 of the present invention.

The steps in manufacturing the semiconductor device shown in FIG. 13. As shown in FIG. 14, the element isolation region 14 is formed on the semiconductor substrate 13, and an impurity is injected or diffused in the surface of the semiconductor substrate 13 to form a conductive region 13a. A gate insulating film 15 constituted by a thermal oxide film is formed on the surface of the semiconductor substrate 13, and a conductive material serving as the wirings 16 and the silicon oxide film 17 are stacked and patterned to have the shapes of the wirings 16. An insulating film constituted by a silicon oxide film is stacked on the entire surface of the semiconductor device. This insulating film is anisotropically etched to have a uniform thickness from the surface to form the side walls 18. The etching stopper film 20 constituted by a silicon nitride film ($Si_3N_4$) containing nitrogen atoms and serving as a stopper film in formation of a contact hole is stacked on the entire surface of the resultant structure. The insulating interlayer 21 constituted by a silicon oxide film is stacked on the resultant structure, and the resultant structure is etched back by reflowing or RIE by heating to make the surface of the insulating interlayer planar. Thereafter, a reflection prevention film 27 consisting of a material containing nitrogen atoms is stacked on the entire surface of the insulating interlayer 21 to have a film thickness equal to that of the etching stopper film 20, and a resist pattern 28 having an opening b formed in the upper portion of the conductive region 13a is formed by photolithography.

Figure 15:
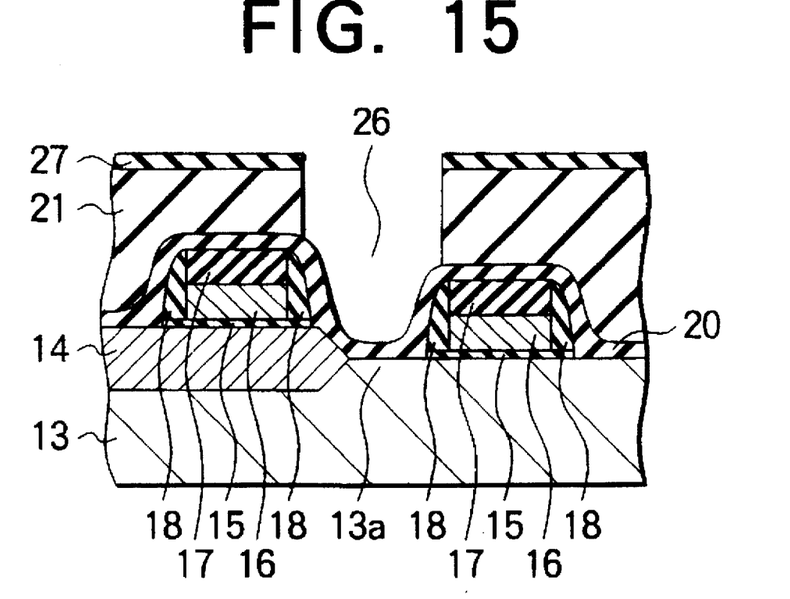
FIG. 15 is a sectional view showing one step of a method of manufacturing a semiconductor device according to Embodiment 3 of the present invention.

As shown in FIG. 15, the reflection prevention film 27 is selectively removed by etching using the resist pattern 28 as an etching mask under a condition in which the selectivity ratio of the silicon nitride film to the resist pattern is high, and the insulating interlayer 21 is selectively removed by etching under a condition in which the selectivity ratio of the silicon oxide film to the resist pattern is high. According to a self-alignment contact scheme, the contact hole 26 for forming a bit line contact (BC) is formed. Thereafter, the resist pattern 28 is removed by ashing to expose the reflection prevention film 27 stacked on the insulating interlayer 21 and the etching stopper film 20 located on the bottom surface of the contact hole 26.

In ashing of resist pattern 28, a thin oxide film is formed on the surface of the etching stopper film 20. When the next step is executed without removing this oxide film, the etching stopper film 20 may be prevented from being removed. As a method of removing the thin oxide film to solve the above problem, the following method is available. That is, the step of removing an oxide film using $CF_4/O_2$ is additionally executed when the etching stopper film 20 is removed by etching, or light etching using hydrogen fluoride (HF) is performed before the etching stopper film 20 is removed by etching, thereby removing the oxide film. When this step is added, a semiconductor device having high dimensional precision and stable characteristics can be formed, and a yield in the manufacturing processes can be improved.

Figure 16:
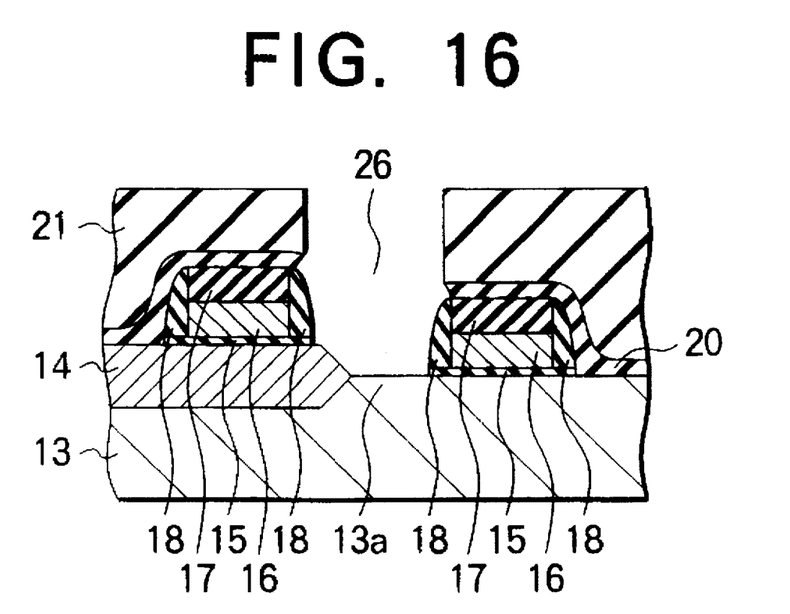
FIG. 16 is a sectional view showing one step of a method of manufacturing a semiconductor device according to Embodiment 3 of the present invention.

Thereafter, as shown in FIG. 16, in order to simultaneously remove the reflection prevention film 27 and the etching stopper film 20 on the contact formation region, isotropic etching is performed. In this case, since the reflection prevention film 27 consists of a material containing nitrogen atoms, the reflection prevention film 27 has a film seed similar to that of the etching stopper film 20. For this reason, the reflection prevention film 27 has a selectivity ratio to a specific film, e.g., a silicon oxide film, which is almost equal to a selectivity ratio to the film of the etching stopper film 20, and the reflection prevention film 27 and the etching stopper film 20 can be simultaneously removed. As a method of simultaneously removing the etching stopper film 20 and the reflection prevention film 27, etching is performed in an isotropic etcher using an $SF_6/O_2/Ar$-gas system. The selectivity ratio of the etching rate of the nitride film constituting the etching stopper film 20 to the etching rate of an oxide film is about 3.

By using a microloading effect in which the higher the aspect ratio of the contact hole becomes, the more removal of the material located on the bottom surface of the contact hole becomes difficult under the same condition, the etching rate of the etching stopper film 20 in the contact hole 26 becomes lower than that of the reflection prevention film 27 in an open space. Therefore, even if the reflection prevention film 27 is formed to have a thickness considerably larger than that of the etching stopper film 20, the reflection prevention film 27 can be completely removed.

After the etching stopper film 20 and the reflection prevention film 27 are simultaneously removed, a by-product or the like adhered to the inner wall of the contact hole 26 is removed by a chemical dry etching (CDE) process. The step of cleaning a contact interface is added, thereby obtaining a semiconductor device having more stable performance.

The etching stopper film 20 and the reflection prevention film 27 are simultaneously removed by isotropic dry etching, and the conductive region 13a on the surface of the semiconductor substrate 13 is exposed. Thereafter, a conductive material is buried in the contact hole 26 to form the contact 22, so that the upper wiring layer 23 can be patterned to be in contact with the contact 22.

As has been described above, according to Embodiment 3, in contact formation of the self-alignment scheme using the etching stopper film 20, the reflection prevention film 27 and the etching stopper film 20 can be simultaneously removed. For this reason, a semiconductor device having high dimensional precision and stable characteristics can be formed in a small number of steps, and a yield in the manufacturing processes can be improved.

In addition, the etching rate of the etching stopper film 20 in the contact hole and the etching rate of the reflection prevention film 27 in the open space can be made different from each other by the microloading effect. The selectivity ratio of the reflection prevention film 27 in the open space can be effectively increased. For this reason, even if the reflection prevention film 27 is formed to have a thickness which is considerably larger than that of the etching stopper film 20, the reflection prevention film 27 and the etching stopper film 20 can be completely removed.

What is claimed is:

1. A method of manufacturing a semiconductor device comprising the steps of:

forming a wiring on one major surface of a semiconductor substrate;

forming an insulating film covering the upper and side surfaces of said wiring;

forming an etching stopper film on the entire surface of said semiconductor substrate;

forming an insulating interlayer on said etching stopper film;

forming a reflection prevention film on said insulating interlayer;

forming a resist pattern having a pattern having the same shape as that of a contact hole on said reflection prevention film;

removing said reflection prevention film and said insulating interlayer located on a contact formation region by using said resist pattern as an etching mask;

removing said resist pattern and simultaneously removing said reflection prevention film and said etching stopper film on the contact formation region by etching to form a contact hole; and exposing one major surface of said semiconductor substrate of the contact hole formation region and burying a conductive material in said contact hole to form a contact.

2. A method of manufacturing a semiconductor device according to claim 1, wherein said etching stopper film and said reflection prevention film includes a material containing nitrogen.

3. A method of manufacturing a semiconductor device according to claim 2, wherein said etching stopper film and said reflection prevention film have film thicknesses which are almost equal to each other.

4. A method of manufacturing a semiconductor device according to claim 3, wherein the step of forming said contact hole includes the step of simultaneously removing said reflection prevention film and said etching stopper film on the contact formation region by anisotropic etching.

5. A method of manufacturing a semiconductor device according to claim 3, wherein the step of forming said contact hole includes the step of simultaneously removing said reflection prevention film and said etching stopper film on the contact formation region by isotropic etching.

6. A method of manufacturing a semiconductor device according to claim 2, wherein when said reflection prevention film is formed to have a thickness larger than said etching stopper film, the step of forming said contact hole includes the step of simultaneously removing said reflection prevention film and most of said etching stopper film on the contact formation region by anisotropic etching and removing the remaining etching stopper film by anisotropic etching.

7. A method of manufacturing a semiconductor device according to claim 2, wherein when said reflection prevention film is formed to have a thickness larger than said etching stopper film, the step of forming said contact hole includes the step of simultaneously removing most of said reflection prevention film and said etching stopper film on the contact formation region by etching using a microloading effect.

8. A method of manufacturing a semiconductor device according to claim 2, wherein the step of forming said contact hole includes the step of simultaneously removing said reflection prevention film and said etching stopper film on the contact formation region by anisotropic etching and removing the remaining etching stopper film by anisotropic etching.

* * * * *